United States Patent
Thornley et al.

(12)

(10) Patent No.: US 6,954,083 B1
(45) Date of Patent: Oct. 11, 2005

(54) CIRCUIT FOR DETECTION OF HARDWARE FAULTS DUE TO TEMPORARY POWER SUPPLY FLUCTUATIONS

(75) Inventors: Randal Thornley, Nampa, ID (US); Gyle D. Yearsley, Boise, ID (US); Dale Wilson, Nampa, ID (US); Joshua J. Nekl, Nampa, ID (US); William J. Tiffany, Boise, ID (US)

(73) Assignee: ZiLOG, Inc., San Jose, CA (US)

( * ) Notice: Subject to any disclaimer, the term of this patent is extended or adjusted under 35 U.S.C. 154(b) by 46 days.

(21) Appl. No.: 10/750,232

(22) Filed: Dec. 29, 2003

(51) Int. Cl.[7] .............................................. H03K 19/00

(52) U.S. Cl. ................................ 326/16; 326/9; 326/14

(58) Field of Search ..................... 326/9, 1, 16

(56) References Cited

U.S. PATENT DOCUMENTS 6,198,401 B1 *  3/2001  Newton et al. .............. 340/635

* cited by examiner

*Primary Examiner*—Anh Q. Tran
(74) *Attorney, Agent, or Firm*—Silicon Edge Law Group LLP; T. Lester Wallace; Darien K. Wallace

(57) ABSTRACT

Fast electromagnetic transient (EFT) events of short duration are often not detected by power-on reset circuitry of an integrated circuit (IC). A fault detector circuit involves many fault detectors. The fault detectors are distributed across the IC and may be embodied in spare cells left in a standard cell IC. Each fault detector is initialized with a digital logic value. The fault detector circuit is then controlled such that the digital logic value stored should not change if the IC is operated under normal operating conditions. An EFT event that is undetected by the power-on reset circuit may, however, cause one of the digital logic values stored in one of the fault detectors to switch. If the digital logic value stored in any one of the fault detectors switches, then a fault signal is provided to the power-on reset circuit that in turn resets the IC.

25 Claims, 1 Drawing Sheet

CIRCUIT FOR DETECTION OF HARDWARE FAULTS DUE TO TEMPORARY POWER SUPPLY FLUCTUATIONS

TECHNICAL-FIELD

The present invention relates to detecting faults on an integrated circuit due to supply voltage fluctuations of short duration.

BACKGROUND

Integrated circuits may be designed by describing the functionality of a circuit using computer-aided design (CAD) tools such that a netlist of circuit components is generated. Each circuit component of the netlist can be realized by a corresponding type of standard cell in a library of standard cells. In a place operation, the various circuit components of the netlist are associated with corresponding standard cells of a virtual standard cell integrated circuit. Then, in a process called routing, the software forms virtual interconnections between the various standard cells identified in the place operation. The placed and routed virtual circuit is the original circuit described by the original netlist. The result of this design process is a computer output. The computer output is usable to make photolithographic masks for making a standard cell integrated circuit that includes the circuit of the original netlist.

Very large integrated circuits can be made using this standard cell technique. If an error is found in a circuit design after a lot of effort has gone into placing and routing a design, it is desirable to be able to correct the error without redoing the work already done. If a few spare standard cells are left here and there on the integrated circuit die, and if a minor error is later found in the design, then only a few minor changes to a metal interconnection layer may be required to patch in those spare standard cells to fix the error. For this reason, circuit development software sometimes includes a tool for automatically sprinkling groups of spare standard cells across a standard cell integrated circuit design. If there is no error found, then these spare standard cells are not incorporated into the final circuit.

A microcontroller or a part of a microcontroller may be designed using such a standard cell design process. Such a microcontroller may see use in noisy applications that often involve poor power and ground conditioning. In such a noisy application, unwanted noise can be introduced onto the microcontroller integrated circuit through the power, ground and other terminals of the integrated circuit. Examples of unwanted noise include transients due to electromagnetic interferences (EMI) and electrostatic discharges (ESD). The supply voltage that is supplied to the integrated circuit to power the circuitry of the integrated circuit may momentarily deviate outside the specified power supply operating range and this unwanted supply voltage fluctuation may be introduced into the integrated circuit through the power and ground terminals.

When microcontroller operation resumes after one of these out-of-specification conditions, the microcontroller is to behave in a consistent and anticipatable manner. An out-of-specification power supply condition or a noise condition may, however, cause a digital logic value stored in a flip-flop or other sequential logic element to change states. If, for example, the flip-flops in the program counter are disturbed in a random fashion, then the microcontroller may recover from out-of-specification conditions in different ways from occurrence to occurrence. This is undesirable. If such a fault occurs, the microcontroller is to be reset such that the microcontroller will begin executing code at the same known location after each such occurrence.

A voltage brownout and power-on reset (VBO/POR) circuit is typically provided on a microcontroller. Under certain conditions, the VBO/POR circuit outputs a reset signal that resets the microcontroller. If, for example, the power supply voltage of the microcontroller drops below a predetermined minimum and then returns to the specified operating range, the VBO/POR circuit detects this condition and outputs the reset signal. The microcontroller is reset and therefore resumes operation after the occurrence in a consistent and known manner.

A conventional VBO/POR circuit, however, typically does not detect or respond to power supply spikes of very short duration. In automotive or motor control applications, a high voltage transient of short duration called a fast electromagnetic transient (EFT) event can be experienced. A high voltage pulse of approximately two thousand volts can be imposed for a short period of approximately one to two hundred nanoseconds on a terminal of the microcontroller integrated circuit. The EFT event may cause the voltage difference between the supply voltage and ground buses internal to the integrated circuit to exceed a supply voltage maximum VCC(max) momentarily, or to fall below a supply voltage minimum VCC(min) momentarily. Because the EFT event is of such short duration, however, it goes undetected by the conventional VBO/POR circuit. The digital logic values stored in flip-flops and other sequential logic elements in the microcontroller can be disturbed, but the disturbance goes undetected. A microcontroller having a conventional VBO/POR circuit may therefore fail to be reset following an EFT event. Erratic and inconsistent microcontroller operation may result.

A solution is desired.

SUMMARY

Groups of spare standard cells are distributed across a standard cell integrated circuit. Each such group of spare standard cells may be an island surrounded or substantially surrounded by circuitry of the circuit to be monitored. One hardware fault detector is realized in each corresponding one of these groups of spare standard cells. These hardware fault detectors, which are spread across the integrated circuit, are networked together using other logic in other ones of the spare standard cells. If any one of the fault detectors detects a fault condition, then a reset circuit on the integrated circuit is triggered such that the reset circuit outputs a reset signal. The reset signal may, for example, cause some or all of the sequential logic elements on the integrated circuit to be reset.

The fault detectors operate on the basis that a brief local power fluctuation or other disturbance caused by an external event (for example, an EMI event, an ESD event) may cause a sequential digital logic element to be disturbed and to change the digital logic value it stores. If the digital logic value stored by any of the fault detectors changes, then this condition is detected and used to trigger the reset circuit. The reset circuit in turn outputs the reset signal that resets the circuit being monitored. In the event that the circuit being monitored is a microcontroller, the reset signal may initialize (for example, reset) the program counter of the microcontroller such that when the microcontroller recovers from the fault condition it starts executing from a repeatable and known location in memory.

In one example, each of the fault detectors includes a pair of flip-flops. One of the flip-flops is initialized by an asynchronous preset signal on power-on reset to store a digital logic high. The other of the flip-flops is initialized by an asynchronous clear signal on power-on reset to store a digital logic low. Once initialized, the preset and clear signals are deasserted. After the preset and clear signals are deasserted and the power-on-reset period has passed, no clock signal is applied to the clock input leads of the flip-flops. The flip-flops therefore continue to store their initialized values if the flip-flops operate as they should under normal supply voltage conditions. If a transient event then occurs (for example, a fast electromagnetic transient (EFT)) that causes one or both of the flip-flops to change its state, then the output of the flip-flop(s) will change. This condition is detected by combinatorial logic that performs a logical OR function. If the first, second or both flip-flops of any of the fault detectors changes state, then the combinatorial logic supplies a fault output signal to the reset circuit. The reset circuit may, for example, be a power-on reset circuit. The reset circuit in turn generates the reset signal that resets or otherwise initializes the circuit being monitored in a desired manner.

In one embodiment, the reset circuit is a voltage brown-out/power on reset (VBO/POR) circuit that monitors the supply voltage of a processor. If the VBO/POR detects that the supply voltage has fallen below a predetermined minimum, or if the VBO/POR detects that the supply voltage exceeds a predetermined maximum, then the VBO/POR outputs the reset signal that resets the processor. When the VBO/POR outputs the reset signal, it also sets a first bit in a status register. When the processor recovers from the reset condition, the processor can read the status register and determine from the value of the first bit whether the reset condition was due to the out-of-voltage condition detected by the VBO/POR circuit.

The VBO/POR circuit does not, however, typically detect an out-of-voltage condition of two hundred nanoseconds or less. The networked fault detectors, however, are more sensitive to detecting these short out-of-voltage conditions of two hundred nanoseconds or less. One or more of the networked fault detectors detects the short out-of-voltage condition or short duration and triggers the reset circuit. In addition to triggering the reset circuit, a second bit in the status register is set. When the processor recovers from the reset condition, the processor can read the status register and determine from the value of the second bit whether the reset condition was due to a fault detected by the network of fault detectors. If the processor reads the status register and finds the second bit set and the first bit not set, then the processor may determine that a fast electromagnetic transient (EFT) occurred.

In one embodiment, a computer aided design (CAD) tool adds the fault detector circuit to a circuit to be monitored. The fault detector circuit is added such that the fault detectors are distributed across the circuit to be monitored. The fault detector circuits can be placed by the CAD tool, or can be placed under CAD tool assistance, to be near to power and ground wire bond pads or flip-chip pads. Where the circuit to be monitored is part of a standard cell integrated circuit, the fault detectors can be implemented in otherwise unused standard cells. Where the circuit to be monitored is part of a programmable logic device (for example, an FPGA or a CPLD), the fault detectors can be implemented in otherwise unused configurable logic blocks.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
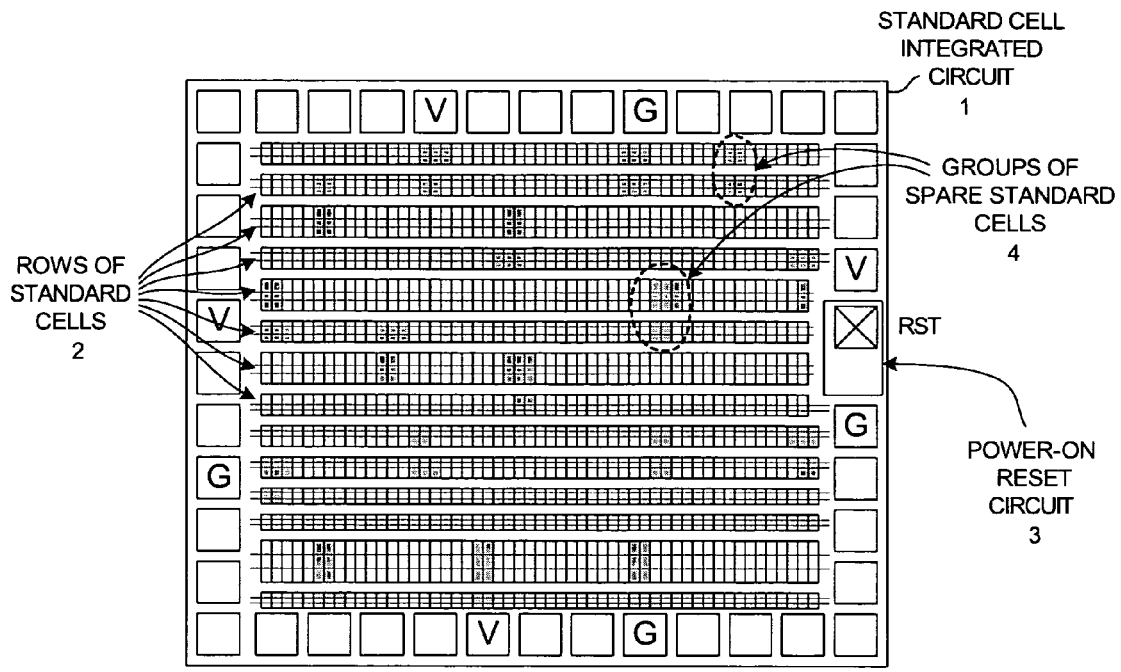
FIG. 1 is a simplified top-down schematic diagram of a standard cell integrated circuit in accordance with one embodiment.

FIG. 1 is a simplified top-down diagram of a standard cell integrated circuit 1. Integrated circuit 1 includes a plurality of rows of standard cells 2. The standard cells shown in white are standard cells that are interconnected to form a circuit to be monitored. In the illustrated embodiment, the circuit to be monitored is a microcontroller. The microcontroller involves a processor and other peripheral and input/output circuitry.

The rows of standard cells 2 are surrounded by a ring of input/output cells. Each input/output cell includes a bonding pad. Bond wires (not shown) extend from the bonding pads to corresponding landing pads on an integrated circuit package. The integrated circuit package houses the integrated circuit. Some of the bonding pads are used to receive a supply voltage (Vcc) that powers the integrated circuit. These bonding pads are labeled with a "V" in the diagram. Others of the bonding pads are used to couple ground potential to the integrated circuit. These bonding pads are labeled with a "G" in the diagram.

One of input/output cells includes a voltage brown out and power-on reset circuit 3. This input/output cell has a bonding pad RST that is bonded out to a reset terminal of the integrated circuit package. If a low reset signal is present on the reset terminal of the integrated circuit package, then the VBO/POR circuit 3 resets the microcontroller circuitry in a desired manner. It is to be understood that the diagram of FIG. 1 is a simplified diagram and that the real microcontroller has additional complexities not related to the discussion here.

The particular microcontroller in the example being described is designed using a computer-aided design (CAD) tool. The CAD tool automatically causes groups of spare standard cells 4 to be sprinkled across the standard cell integrated circuit. Each group of spare cells contains several standard cells of different types. In the present example, each group contains at least two flip-flops and a two-input-lead logic gate. In FIG. 1, the spare standard cells are shown darkened.

Figure 2:
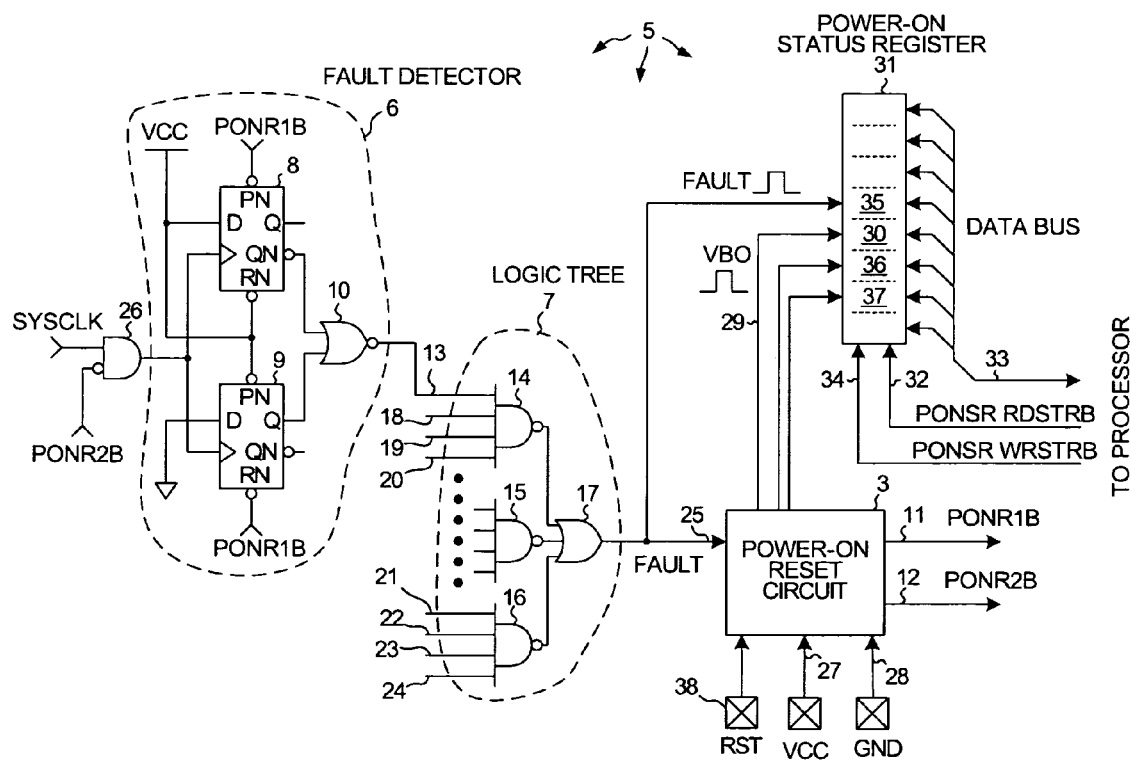
FIG. 2 is a circuit diagram that illustrates a fault detect circuit that is realized in the groups of spare standard cells of the integrated circuit of FIG. 1 in accordance with one embodiment.

FIG. 2 is a simplified circuit diagram of one specific embodiment of a fault detector circuit 5 that is embodied in the standard cell integrated circuit 1 of FIG. 1. Fault detector circuit 5 includes a plurality of fault detectors 6, a logic tree 7 and the VBO/POR circuit 3. One fault detector is realized in each of the groups of spare standard cells illustrated in darkened form in FIG. 1. The logic gates of logic tree 7 are likewise realized using spare standard cells.

In one embodiment, fault detector circuit 5 is added to the circuit to be monitored (in this case, a microcontroller) using the same computer-aided design (CAD) tool used to design and layout the circuit being monitored. Each of the fault detectors has the same circuitry. This circuitry is described in connection with fault detector 6.

Fault detector 6 includes a first digital logic storage element 8 and a second digital logic storage element 9. Digital logic storage elements 8 and 9 are flip-flops having asynchronous preset input leads and asynchronous clear input leads. Fault detector 6 further includes a NOR gate 10. In a power-on reset condition when power is initially applied to the integrated circuit 1, VBO/POR circuit 3 outputs two active low power-on reset signals, PONR1B and POINR2B. PONR1B is output on lead 11. POINR2B is output on lead 12. PONR1B transitions high first and then PONR2B transitions high.

PONR1B is supplied to the asynchronous preset input lead of flip-flop 8 and to the asynchronous reset input lead of flip-flop 9. Flip-flop 8 is therefore set and outputs a digital logic low to the upper input lead of NOR gate 10. Flip-flop 9 is cleared and outputs a digital logic low onto the lower input lead of NOR gate 10. Because neither input lead of NOR gate 10 receives a digital logic high signal, NOR gate 10 outputs a digital logic high onto input lead 13 of logic tree 7.

Logic tree 7 includes NAND gates 14–16 and OR gate 17. Logic tree 7 therefore performs a logical-OR function in that if a digital logic low is present on any one of the input leads 13, 18–24, then an active high fault signal FAULT is asserted onto an input lead 25 of VBO/POR circuit 3. During the time that PONR1B is low, the FAULT signal is kept at a digital logic low. The system clock signal SYSCLK on the upper input lead of AND gate 26 is clocking. The PONR2B signal supplied onto the lower input lead of AND date 26 is a digital logic low, so the system clock signal SYSCLK is supplied to the clock input leads of flip-flops 8 and 9. Because flip-flops 8 and 9 are being asynchronously preset and cleared, however, the clocking of the flip-flops has no effect.

VBO/POR circuit 3 then causes the PONR1B signal to transition high. The asynchronous preset and clear signals are removed from flip-flops 8 and 9. Supply voltage Vcc is present on the D input lead of flip-flop 8. Accordingly, clocking flip-flop 8 does not change the digital logic high value stored in flip-flop 8. Similarly, ground potential is present on the D input lead of flip-flop 9, so clocking flip-flop 9 does not change the digital logic low value stored in flip-flop 9.

VBO/POR circuit 3 then causes the PONR2B signal to transition high. This stops the system clock SYSCLK from clocking flip-flops 8 and 9. Flip-flop 8 therefore holds its digital logic high value, and flip-flop 9 holds its digital logic low value. As long as the flip-flops 8 and 9 remain powered from a supply voltage that remains within a normal operating supply voltage range (for example, 3.3 volts) and other circuit operating conditions (for example, temperature) are maintained within normal operating specifications, flip-flop 8 should continue to store the digital logic high and flip-flop 9 should continue to store the digital logic low. The fault detector 6 should therefore continue to output a digital logic high onto the input lead 13 of the logic tree 7.

The same conditions apply to the circuitry of all the other fault detectors (not shown) of fault detector circuit 5 that supply signals onto the other input leads 18–24 of logic tree 7. As long as integrated circuit 1 continues to be supplied with a supply voltage Vcc that stays within the normal operating supply voltage range, each of the fault detectors should continue to output a digital logic high onto its respective input lead to the logic tree 7. The fault signal FAULT supplied onto the input lead 25 of the VBO/POR circuit 3 should therefore remain at a digital logic low.

In one embodiment, VBO/POR circuit 3 monitors the supply voltage Vcc by detecting the voltage difference between VCC input lead 27 and GND input lead 28. If VBO/POR circuit 3 detects the voltage between input leads 27 and 28 to have fallen below a predetermined voltage, then VBO/POR circuit 3 outputs a "voltage brownout" VBO signal on output lead 29 and outputs the active low reset signals PONR1B and PONR2B as set forth above. These active low reset signals PONR1B and PONR2B will cause some of the sequential logic elements of the circuit being monitored to be initialized to predetermined desired values. In the case where the circuit being monitored is a microcontroller, the program counter of the microcontroller is initialized to a known starting value.

The asserting of the VBO signal on output lead 29 sets a first bit 30 in a power-on status register 31. This first bit 30 of the power-on status register 31 is not reset by the reset signals PONR1B and PONR2B. The power-on status register 31 can be read from and written to by the processor of the microcontroller. The processor can read power-on status register 31 by asserting a power-on status register read strobe signal PONSR_RDSTRB on lead 32. When this strobe signal is asserted, the data contents of the power-on status register 31 are output by the register onto the data bus 33 of the processor. The processor can write to the power-on status register 31 by placing the data to be written onto the data bus 33 and then asserting a power-on status register write strobe PONSR_WRSTRB on lead 34. The data on the data bus 33 is then clocked into the power-on status register 31.

When the reset condition has passed, the processor resumes executing instructions from the memory location determined by the initialization of its program counter. A power-on status register read routine is present in program memory starting at this location. The processor therefore executes the power-on status register read routine and reads the contents of the power-on status register 31. Because the first bit 30 is set, the processor determines that VBO/POR circuit 3 detected a voltage brown-out condition where the voltage between input leads 27 and 28 dropped below the predetermined brownout voltage.

The VBO/POR circuit 3 is, however, in this embodiment not able to detect a transient condition where the voltage between input leads 27 and 28 is above the normal operating supply voltage for only a very short period of time. For example, VBO/POR circuit 3 in this example is generally not able to detect an isolated 2000 volt spike on the VCC input lead 27 where the duration of the spike is two hundred nanoseconds or less.

Fault detect circuit 6 is, however, more likely to detect this isolated 2000 volt spike. The way the energy of the spike is dissipated across the circuitry of the integrated circuit 1 may be complex and may vary from spike to spike. More energy and therefore voltage fluctuation may be present on some parts of the integrated circuit than are present on other parts of the integrated circuit. The relatively spike-sensitive fault detectors being dispersed across the integrated circuit 1 as illustrated in FIG. 1 increases the likelihood that the spike will be detected by one of the fault detectors. Also, in addition to the fault detectors being dispersed across integrated circuit 1, the fault detectors are in this embodiment disposed such that a fault detector is located near each of the input/output cells used to couple the integrated circuit 1 to either Vcc or ground.

If, for example, the energy of the spike is manifest such that the digital value stored in flip-flop 8 of fault detector 6 were to change states from a digital logic high to a digital logic low, then fault detector 6 would output a digital logic low onto input lead 13 of logic tree 7. Signal FAULT therefore would transition to a digital logic high. This transition would set a second bit 35 in the power-on status register 31 and would trigger VBO/POR circuit 3. VBO/POR circuit 3 would in turn assert the reset signals PONR1B and PONR2B as set forth above. The reset signals would in turn reset the program counter of the processor. Due to the assertion of the active low reset signals PONR1B and PONR2B, the fault detectors of fault detector circuit 5 would be initialized and the FAULT signal would be deasserted.

After the reset period has passed, the processor would resume executing instructions starting at the memory location determined by the resetting of the program counter of the processor. As described above, a power-on status register read routine is present in memory at this location. The processor therefore would read the power-on status register 31. From the value of the second bit 35, the processor would determine that the previous reset condition was caused by fault detector circuit 5.

In addition to the first bit 30 and the second bit 35, power-on status register 31 can have other bits such as a reset terminal reset bit 36, and a watch dog timer reset bit 37. The reset terminal reset bit 36 is set if the VBO/POR circuit 3 detects that an active low reset signal is present on an external reset terminal 38 of the integrated circuit package. The watch dog timer bit 37 is set if a watch dog timer (not shown) times out.

Fault detector 6 may be implemented using digital logic components that are identical to digital logic components used to implement the circuit to be monitored. Alternatively, fault detector 6 may be implemented using circuitry that is more susceptible to being disturbed by EFT events. A flip-flop within fault detector 6 may involve a latch where the latch includes a primary logic element as well as a feedback inverter. The function of the feedback inverter is to maintain the digital logic value on an input lead of the primary logic element when the digital logic value being stored in the latch is not being changed. To make the flip-flop more susceptible to being disturbed by EFT events, the current driving capability of the feedback inverter is reduced in comparison to the current leakage off the input lead of the primary logic element to the point that the feedback inverter can just barely maintain the charge on the input lead of the primary logic element. The feedback inverter may, for example, be coupled to the input lead of the primary logic element through a resistor.

The standard cell integrated circuit of FIG. 1 is but one example of an integrated circuit that can have a fault detector circuit. In another example, the integrated circuit is a programmable logic device (for example, a field programmable gate array (FPGA) or a complex programmable logic device (CPLD)). The fault detectors of the fault detector circuit may, for example, be embodied in unused logic blocks in such a programmable logic device. Although the integrated circuit of FIG. 1 includes wire bond pads, the fault detector circuit sees use in other types of integrated circuits. In one example, the integrated circuit is flip-chip mounted in an integrated circuit package using flip-chip bond pads and bond balls located on the face side of the integrated circuit die. Such flip-chip bond pads and bond balls can be located at the periphery of the integrated circuit die. Such flip-chip bond pads and bond balls can also be distributed across the central portion of the face side of the die. In one embodiment, the spare circuitry from which the fault detectors are fashioned is grouped at the various flip-chip bond pads through which the integrated circuit receives power and through which the integrated circuit is grounded. Although the fault detector circuit is described above in a situation where the fault detectors are embodied in spare circuitry provided by CAD tools, this need not be the case. Circuitry of the fault detector circuit may be embodied in full custom circuitry. Fault detectors may realized in circuitry other than spare logic left by CAD tools in a circuit to be monitored.

The mechanism by which EFT energy flows across the integrated circuit chip and causes a logic state in a fault detector to switch may be complex and not entirely understood. The way the energy flows may differ from EFT event to EFT event. The fault detector circuit nevertheless sees use where the fault detectors are seen to detect EFT events better than the power-on reset circuit employed, even if the exact mechanisms at work at not entirely understood. In addition to detecting possible EFT events, the fault detector circuit can detect faults due to alpha particle radiation and/or other types of radiation that cause the contents of flip-flops to switch. The fault detector circuit may, for example, be employed in a space or military application where noise is not present on the power and ground leads of the integrated circuit but rather where the transient event is caused by a high energy particle passing into or through the integrated circuit. The circuitry of the fault detectors can be modified to increase the ability of the fault detectors to detect particle radiation.

Although the present invention has been described in connection with certain specific embodiments for instructional purposes, the present invention is not limited thereto. The reset circuit of the fault detector circuit need not in all embodiments be a power-on reset circuit. Although a fault detector of fault detector circuit 5 is described above in connection with the particular fault detector of FIG. 2, other types of fault detectors can be employed in fault detector system 5. A sequential logic element such as a memory cell can be used to store a digital logic value whose state can be changed by an EFT event. Transistors and analog circuit components not ordinarily employed in the digital logic circuitry of the circuit being monitored can be used in the fault detectors. The fault detector circuit can be employed to detect faults at the circuit board level. Fault detectors can, for example, be spread across the various discrete integrated circuits on a printed circuit board or other system, and the outputs of the various fault detectors can supplied by a logic tree to a single reset circuit. The various fault detectors of a fault detector system need not all be identical but rather can be different types of circuits designed to detect different types of transient conditions. Multiple fault detectors and an associated logic tree can be implemented without the output of the logic tree being coupled to a reset circuit.

Rather than using a logic tree of combinatorial logic to detect when one of many fault detectors has detected an EFT event, a fault detector circuit can involve a series of flip-flops that are chained together to form a long shift register, but where the flip-flops are distributed throughout a circuit to be monitored. Each flip-flop of the shift register is loaded with a predetermined value and this is accomplished by serially loading a bit stream into the shift register. At some time later, the contents of the flip-flops are read back out of the shift register in the form of a serial bit stream. If the content of one or more of the flip-flops is determined to have changed, then an EFT fault signal is generated. The flip-flops of a JTAG register may, in some embodiments, be used to form a shift register that performs an EFT detection function. Accordingly, various modifications, adaptations, and combinations of various features of the described embodiments can be practiced without departing from the scope of the invention as set forth in the claims.

What is claimed is:

1. An integrated circuit comprising:
   a plurality of digital logic storage elements, each of the digital logic storage elements being initialized to store a first digital logic value, each digital logic storage element being controlled after it is initialized such that it continues to store the first digital logic value throughout a period if the integrated circuit is powered from a supply voltage that remains within a normal operating supply voltage range, wherein each digital logic storage element outputs an output signal indicative of whether the digital logic storage element is storing a second digital logic value;
   a logic tree that receives the output signals from said plurality of digital logic storage elements, the logic tree outputting a fault output signal; and
   a reset circuit that receives the fault output signal from the logic tree, the reset circuit generating a reset signal if the output signal of any of the plurality of digital logic storage elements indicates that the corresponding digital logic storage element is storing said second digital logic value during said period.

2. The integrated circuit of claim 1, wherein the first digital logic value is a digital logic high, wherein said second digital logic value is a digital logic low, wherein the reset circuit generates the reset signal if any of the plurality of digital logic storage elements switches during said period from storing the first digital logic value to storing the second digital logic value.

3. The integrated circuit of claim 1, wherein the digital logic storage element is a flip-flop having a clear input lead, wherein the digital logic storage element is initialized by applying a clear signal to the clear input lead, and wherein during said period the clear signal is not present on the clear input lead.

4. The integrated circuit of claim 1, wherein the digital logic storage element is a flip-flop having a preset input lead, wherein the digital logic storage element is initialized by applying a preset signal to the preset input lead, and wherein during said period the preset signal is not present on the preset input lead.

5. The integrated circuit of claim 1, further comprising:
   a circuit being monitored, wherein the integrated circuit comprises a first set of standard cells and a second set of standard cells, wherein standard cells of the first set are interconnected to form the circuit being monitored, and wherein the plurality of digital logic storage elements are digital logic storage elements of the second set of standard cells.

6. The integrated circuit of claim 3, wherein the plurality of digital logic storage elements are distributed across the integrated circuit such that at least some of the digital logic storage elements are islands surrounded by the circuit being monitored.

7. The integrated circuit of claim 1, wherein the digital logic storage element is a flip-flop, and wherein the digital logic storage element is controlled after it is initialized and throughout said period by: 1) not clocking the digital logic storage element, 2) not clearing the digital logic storage element, and 3) not presetting the digital logic storage element.

8. The integrated circuit of claim 1, further comprising:
   a circuit being monitored, wherein the circuit being monitored comprises digital logic storage elements, and wherein the digital logic storage elements of the circuit being monitored are less susceptible to fast electromagnetic transients (EFT) than are the digital logic storage elements of the plurality of digital logic storage elements.

9. The integrated circuit of claim 1, wherein the integrated circuit is a standard cell integrated circuit, and wherein the reset circuit is a power-on reset circuit.

10. The integrated circuit of claim 1, wherein the logic tree consists only of combinatorial logic, and wherein the logic tree performs a logical OR function.

11. The integrated circuit of claim 1, wherein the reset circuit monitors the supply voltage and generates the reset signal if the supply voltage is detected to be outside the normal operating supply voltage range, but wherein the reset circuit does not detect the supply voltage being outside the normal operating supply voltage range if the supply voltage spikes above the normal operating supply range for an isolated time period of less than two hundred nanoseconds.

12. The integrated circuit of claim 11, further comprising:
   a status register having a first bit and a second bit, the first bit being set by the reset circuit if the reset circuit detects the supply voltage being outside the normal operating supply voltage range, the second bit being set if the logic tree outputs the fault output signal to the reset circuit.

13. The integrated circuit of claim 11, further comprising:
   a processor; and
   a status register having a bit, wherein the bit is set by hardware if the fault output signal is output by the logic tree, and wherein the processor can read the bit of the register.

14. The integrated circuit of claim 13, wherein the reset signal generated by the reset circuit does not reset the bit in the status register.

15. An integrated circuit comprising:
   a plurality of fast electromagnetic transient (EFT) fault detector, the plurality of the EFT fault detector being distributed across at least a portion of the integrated circuit, wherein each of the EFT fault detector outputs a signal indicative of whether said each EFT fault detector has detected an EFT fault; and
   a logic tree that receives the signals output from the plurality of EFT fault detector, the logic tree outputting a fault output signal, the fault output signal being indicative of whether any of the EFT fault detector of the plurality of EFT fault detectors has detected an EFT fault.

16. The integrated circuit of claim 15, wherein the fault output signal is not supplied as an input signal to a reset circuit on the integrated circuit.

17. The integrated circuit of claim 15, further comprising:
   a reset circuit, wherein the fault output signal is supplied as an input signal to the reset circuit.

18. The integrated circuit of claim 15, wherein the integrated circuit further comprises a reset circuit that outputs a reset signal if the reset circuit detects an out-of-specification voltage present between a power supply lead on the integrated circuit and a ground lead on the integrated circuit, and wherein the reset circuit fails to detect an out-of-specification voltage if a two thousand volt spike is present between the power supply lead and the ground lead for less than two hundred nanoseconds, and wherein at least one of the EFT fault detector detects the presence of the spike and in response thereto outputs the signal indicative of the EFT fault detector having detected the presence of an EFT fault.

19. The integrated circuit of claim 15, wherein the integrated circuit is a standard cell integrated circuit, and wherein each of the EFT fault detector is realized in the form of standard cell circuitry.

20. The integrated circuit of claim 15, wherein the integrated circuit is a programmable logic device (PLD), the PLD comprising a plurality of logic blocks and a programmable interconnect structure, and wherein each of the plurality of EFT fault detector is realized in the form of logic block circuitry.

21. An integrated circuit, comprising:
   a first means for detecting a fast electromagnetic transient (EFT) fault having a duration less than two hundred nanoseconds;
   a second means for detecting an EFT fault; and
   a logic tree that receives signals from the first and second means and that outputs a fault detect signal indicative of whether either the first means or the second means has detected an EFT fault.

22. An integrated circuit, comprising:
   a first means for detecting a fast electromagnetic transient (EFT) fault having a duration less than two hundred nanoseconds;
   a second means for detecting an EFT fault;
   a logic tree that receives signals from the first and second means and that outputs a fault detect signal indicative of whether either the first means or the second means has detected an EFT fault;
   a first structure through which the integrated circuit receives a supply voltage, wherein the first means is located adjacent to the first structure; and
   a second structure through which the integrated circuit is coupled to ground potential, wherein the second means is located adjacent to the second structure.

23. A method, comprising:
   providing a plurality of detectors in an integrated circuit, wherein each of said detectors is capable of detecting a fast electromagnetic transient (EFT) fault having a duration less than two hundred nanoseconds; and
   generating, on the integrated circuit, a signal indicative of whether any one of said plurality of detectors has detected an EFT fault.

24. The method of claim 23, wherein each of said detectors is capable of detecting an EFT fault that occurs in the integrated circuit.

25. The integrated circuit of claim 21, wherein the first means detects an EFT fault that occurs in the integrated circuit.

\* \* \* \* \*

UNITED STATES PATENT AND TRADEMARK OFFICE
CERTIFICATE OF CORRECTION

PATENT NO. : 6,954,083 B1
APPLICATION NO. : 10/750232
DATED : October 11, 2005
INVENTOR(S) : Thornley et al.

It is certified that error appears in the above-identified patent and that said Letters Patent is hereby corrected as shown below:

<u>Column 10</u>, lines 44, 46, 50 and 52, "detector" should be changed to --detectors--.
Lines 42-54, claim 15 should read:

--15. An integrated circuit comprising:
a plurality of fast electromagnetic transient (EFT) fault
   detectors, the plurality of the EFT fault detectors being
   distributed across at least a portion of the integrated
   circuit, wherein each of the EFT fault detectors outputs
   a signal indicative of whether said each EFT fault
   detector has detected an EFT fault; and
a logic tree that receives the signals output from the
   plurality of EFT fault detectors, the logic tree outputting
   a fault output signal, the fault output signal being
   indicative of whether any of the EFT fault detectors of
   the plurality of EFT fault detectors has detected an EFT
   fault.--

<u>Column 11</u>, lines 3, 8, and 14, "detector" should be changed to --detectors--.
Lines 1-15, claims 18-20 should read:

--the power supply lead and the ground lead for less than two
hundred nanoseconds, and wherein at least one of the EFT
fault detectors detects the presence of the spike and in
response thereto outputs the signal indicative of the EFT
fault detector having detected the presence of an EFT fault.

19. The integrated circuit of Claim 15, wherein the integrated
circuit is a standard cell integrated circuit, and
wherein each of the EFT fault detectors is realized in the form
of standard cell circuitry.--

UNITED STATES PATENT AND TRADEMARK OFFICE
CERTIFICATE OF CORRECTION

PATENT NO. : 6,954,083 B1
APPLICATION NO. : 10/750232
DATED : October 11, 2005
INVENTOR(S) : Thornley et al.

It is certified that error appears in the above-identified patent and that said Letters Patent is hereby corrected as shown below:

20. The integrated circuit of Claim 15, wherein the integrated circuit is a programmable logic device (PLD), the PLD comprising a plurality of logic blocks and a programmable interconnect structure, and wherein each of the plurality of EFT fault detectors is realized in the form of logic block circuitry.

Signed and Sealed this

Thirtieth Day of October, 2007

JON W. DUDAS
*Director of the United States Patent and Trademark Office*